United States Patent
Lee

(10) Patent No.: US 7,488,649 B2
(45) Date of Patent: Feb. 10, 2009

(54) METHOD OF MANUFACTURING SPLIT GATE TYPE NON-VOLATILE MEMORY DEVICE

(75) Inventor: Yong Jun Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 223 days.

(21) Appl. No.: 11/645,739

(22) Filed: Dec. 27, 2006

(65) Prior Publication Data
US 2007/0148878 A1 Jun. 28, 2007

(30) Foreign Application Priority Data
Dec. 27, 2005 (KR) .................. 10-2005-0130768

(51) Int. Cl.
*H01L 21/336* (2006.01)
(52) U.S. Cl. .................. 438/267; 257/E21.682
(58) Field of Classification Search .................. 438/266, 438/267, 304, 596; 257/E21.682
See application file for complete search history.

(56) References Cited
U.S. PATENT DOCUMENTS
6,117,733 A * 9/2000 Sung et al. .................. 438/265
6,124,609 A * 9/2000 Hsieh et al. .................. 257/315
6,838,343 B2 * 1/2005 Hung et al. .................. 438/267

* cited by examiner

Primary Examiner—Chandra Chaudhari
(74) Attorney, Agent, or Firm—Lowe Hauptman Ham & Berner, LLP

(57) ABSTRACT

A method of manufacturing a split gate type non-volatile memory device includes the steps of defining an active region on a semiconductor substrate; forming a pair of first conductive film patterns, each having an electric charge storage layer interposed between the substrate and the first conductive film pattern, on the active region; forming a second conductive film on top of the first conductive film patterns and a remainder of the active region; etchbacking the entire surface of the second conductive film to planarize a top of the second conductive film formed between the first conductive film patterns; forming a photoresist pattern, with an opening corresponding to the active region between the first conductive film patterns, on the second conductive film; and forming a pair of split gates each having one of the first conductive film patterns and a second conductive film pattern formed by patterning the second conductive film using the photoresist pattern as an etching mask.

12 Claims, 7 Drawing Sheets

METHOD OF MANUFACTURING SPLIT GATE TYPE NON-VOLATILE MEMORY DEVICE

TECHNICAL FIELD

The disclosure relates to a method of manufacturing a semiconductor device, and more particularly, to a method of manufacturing a split gate type non-volatile memory device.

BACKGROUND

Since non-volatile memory devices are possible to electrically erase and store data, and the storage of data is possible without power supply, their applications have been increased in various fields. Such non-volatile memory devices are representatively classified into a NAND-type and a NOR-type. NAND-type memory cells are mainly used for storing data, and NOR-type memory cells are mainly used for booting.

A NOR-type non-volatile memory device is provided with a structure in which a plurality of memory cells each having a single transistor are connected in parallel to a bit line, and only a memory cell transistor is connected between a drain connected to the bit line and a source connected to a common source line. The NOR-type non-volatile memory device has an advantage in that the current of the memory cell is high and a high-speed operation is possible, while the NOR-type non-volatile memory device has a disadvantage in that an area occupied by the contact of the bit line and source line is broad so that high integration is difficult.

If the threshold voltage of the memory cell transistor becomes lower than a voltage (usually 0V) applied to a word line of a non-selection memory cell since the memory cells are connected in parallel to the bit line in the NOR-type non-volatile memory device, a current flows between the source and the drain regardless of the on/off of the selection memory cell so that there occurs malfunction in that all the memory cells are read in an on state. In order to solve such a problem, there has been suggested a non-volatile memory device provided with a structure generally called as a split gate type.

Meanwhile, non-volatile memory devices may be classified into a flash memory device with a lamination structure of a FLOTOX structure and a SONOS device provided with a multi-layered gate insulation film on a structure similar to a MOS transistor. Since the gate insulation film of the SONOS device is a multi-layered insulation film for electric charge storage, in which a charge is stored in a deep level trap, the SONOS device is superior to the flash memory device in view of reliability, and writing and erasing operations are possible under a low voltage.

FIGS. 1 to 3 are views illustrating a method of manufacturing a conventional split gate type non-volatile memory device.

Referring to FIG. 1, a device isolation film (not shown) is formed on a semiconductor substrate 10 to define an active region 11, and an electric charge storage layer, a first conductive film and a capping film are formed in the active region 11. In the electric charge storage layer, an insulation film with a high trap density is interposed between tunnel and blocking insulation films, and a lamination structure of a silicon oxide-silicon nitride-silicon oxide film (ONO film) is generally used. Moreover, a structure with a silicon oxide film serving as a buffer layer and a silicon nitride film servicing as a hard mask layer laminated therein is used as the capping film.

The capping film and the first conductive film and the electric charge storage layer are sequentially patterned to form a first conductive film pattern 16 having an electric charge storage layer 14 with an ONO structure interposed between the active region 11 and the first conductive film pattern 16, and a capping film pattern with oxide film and nitride film patterns 18 and 20 laminated on the first conductive pattern 16.

Referring to FIG. 2, a sidewall insulation film 22 is formed on a sidewall of the first conductive pattern 16, and a gate insulation film 24 is formed on the active region 11. Thereafter, a second conductive film 26 is conformally formed on the gate insulation film 24. At this time, a groove G is formed between the first conductive patterns 16 on the second conductive film 26 to form a sidewall of the second conductive film 26 (see FIG. 4a). Further, a photoresist pattern 28 is formed on the second conductive film 26.

Referring to FIG. 3, the second conductive film 26 is patterned using the photoresist pattern 28 as an etching mask such that the active region 11 between the neighboring first conductive film patterns 16 is exposed. The second conductive film 26 is generally removed through anisotrophic etching, in which there is a case where the etching is not smoothly performed because a polymer or residual product piles up while the anisotrophic etching is progressing on the sidewall of the second conductive film 26 within the groove G. As a result, when even the gate insulation film 24 is exposed by etching the second conductive film 26, conductive stringers 30 remain on the substrate. In a case where time for overetching is prolonged in order to completely remove the conductive stringers 30 formed on the substrate, the substrate may be damaged. On the contrary, unless the conductive stringers 30 are not completely removed, a defect 30a preventing the formation of a silicide and a contact pattern is produced as shown in FIG. 4c so that resistance in an active region is increased and contact resistance is also increased. Further, the defect 30a may result in the production of particles in a subsequent process.

SUMMARY

There is, therefore, a need to provide a method of manufacturing a split gate type non-volatile memory device, wherein, when a second conductive film is deposited and then patterned to form a selection gate, conductive stringers do not remain between first conductive film patterns.

In accordance with an embodiment of the present invention, there is provided a method of manufacturing a split gate type non-volatile memory device, which includes the steps of: defining an active region on a semiconductor substrate; forming a pair of first conductive film patterns, each having an electric charge storage layer interposed between the substrate and the first conductive film pattern, on the active region; forming a second conductive film on top of the first conductive film patterns and the active region outside the first conductive film patterns; etchbacking the entire surface of the second conductive film to planarize a top of the second conductive film formed between the first conductive film patterns; forming a photoresist pattern, with an opening corresponding to the active region between the first conductive film patterns, on the second conductive film; and forming a pair of split gates each having one of the first conductive film patterns and a second conductive film pattern formed by patterning the second conductive film using the photoresist pattern as an etching mask.

In further embodiments, the pair of the first conductive film patterns may be formed by performing the sub-steps of: forming an electric charge storage layer and a first conductive film on the active region of the substrate; and sequentially patterning the electric charge storage layer and the first conductive film to form the pair of the first conductive film patterns facing each other. Further, a capping insulation film may be further formed on each top of the pair of the first conductive film patterns. Furthermore, a sidewall insulation film may be formed on the sidewalls of the pair of the first conductive film patterns, and a gate insulation film may be formed on the active region at both sides of the pair of the first conductive film patterns. Particularly, although a groove may be formed on the second conductive film deposited between the first conductive film patterns, it is preferred that at least the deepest portion of the groove be formed to be higher than that of each of the pair of the first conductive film patterns. The groove may be removed through the etchbacking of second conductive film.

BRIEF DESCRIPTION OF THE DRAWINGS

The above and other objects and features of the present invention will become apparent from the following description of various embodiments given in conjunction with the accompanying drawings, in which:

FIGS. 4a to 4c are images of a scanning electron microscope photographed from a top surface of a substrate, in which FIG. 4a shows a state where a second conductive film for a selection gate is formed and a groove G is then formed on a top of the second conductive film, FIG. 4b shows a state where stringers 30 remains between first conductive film patterns for a control gate, and FIG. 4c shows a defect 30a produced when forming a silicide.

DETAILED DESCRIPTION OF EMBODIMENTS

Hereinafter, various embodiments of the present invention will be described in detail with reference to the accompanying drawings so that they can be readily implemented by those skilled in the art.

Figure 5A:
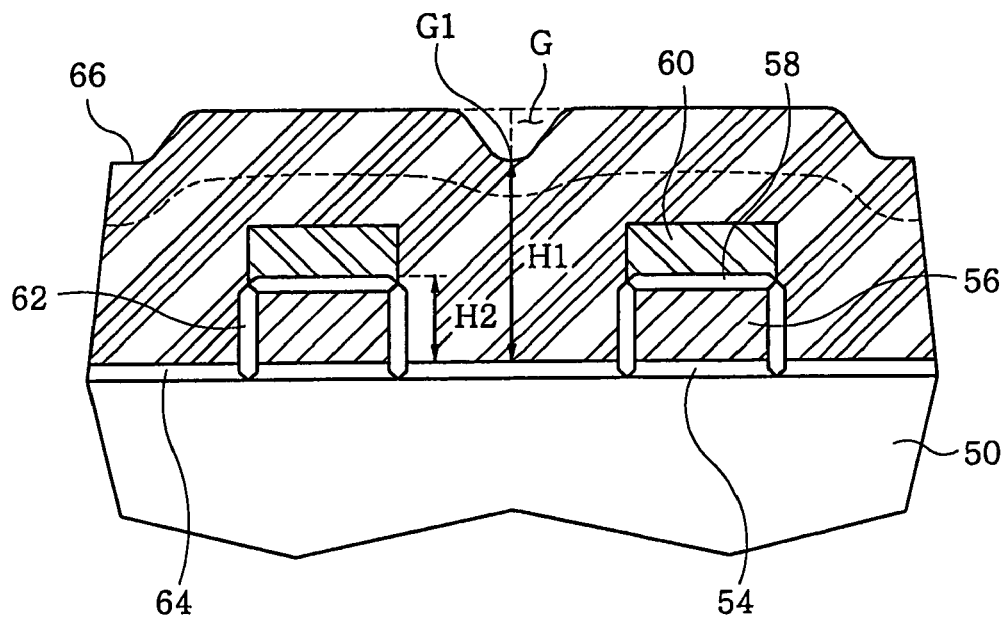
FIGS. 5a to 5c are view illustrating a method of manufacturing a split gate type non-volatile memory device according to an embodiment of the present invention.
Figure 5B:
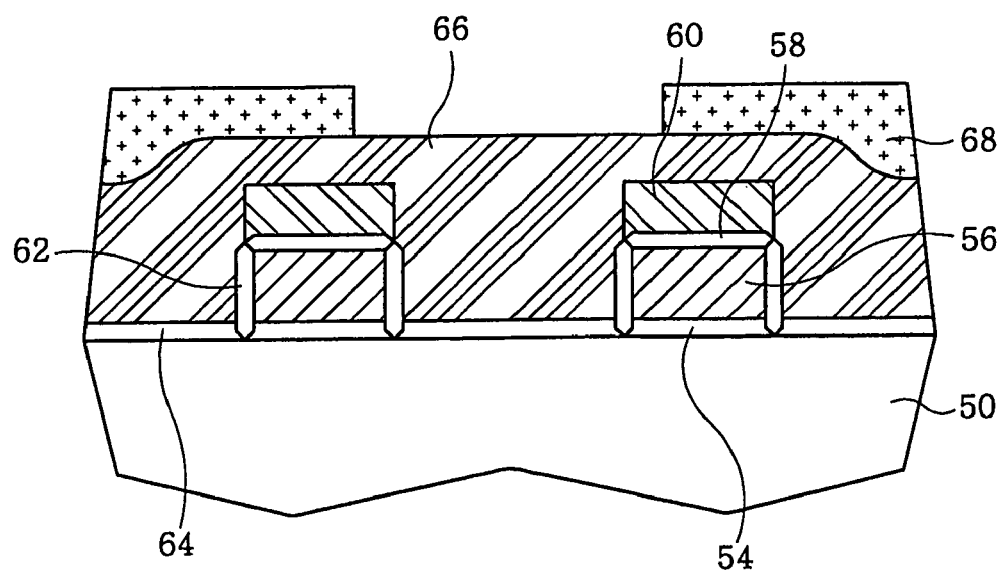
Figure 5C:
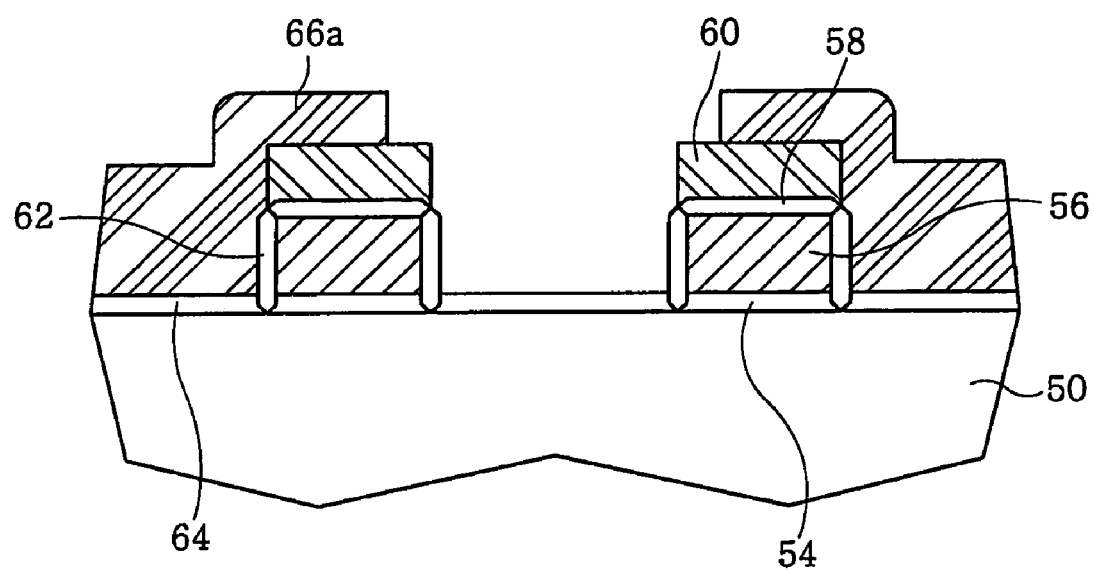

FIGS. 5a to 5c are view illustrating a method of manufacturing a split gate type non-volatile memory device according to an embodiment of the present invention.

Referring to FIG. 5a, a device isolation film (not shown) is formed on a semiconductor substrate 50 to define an active region, and a multi-layered electric charge storage layer (e.g., an ONO film), a first conductive film and a capping layer (e.g., an oxide film for a buffer and a nitride film for a hard mask) are formed in the active region. Thereafter, the capping film, the first conductive film and the electric charge storage layer are sequentially patterned to form a pair of first conductive film patterns 56 each having an electric charge storage layer 54 with an ONO structure interposed between the active region and the first conductive film pattern 56, and a capping film pattern with oxide film and nitride film patterns 58 and 60 laminated on the first conductive pattern 56.

Next, a sidewall insulation film 62 is formed on a sidewall of the first conductive film pattern 56, and a gate insulation film 64 is formed on the active region around the first conductive film patterns 56. Thereafter, a second conductive film 66 is conformally formed on tops of the gate insulation film 64 and the pair of the first conductive film patterns 56. At this time, a groove G may be formed between the first conductive film patterns 56 on the second conductive film 66, in which the height H1 of the deepest portion in the groove G (i.e., the deepest portion G1) is formed to be larger than that H2 of the first conductive film pattern 56. If a capping film pattern is formed on each of the first conductive film pattern 56, the position of the deepest portion of the groove G should be higher than a top of the capping film pattern.

If the second conductive film 66 is formed to be thicker than the thickness of a second conductive film deposited in a general process, the height of the deepest portion G1 of the groove G formed on the second conductive film 66 can be formed so high. That is, although the conductive film 66 is usually formed in a thickness of 2700 Å or so in a related art, it is deposited to be thicker (about 4000 to 5000 Å) than the former in accordance with an embodiment of the present invention. If the second conductive film 66 is thickly formed, the position of the deepest portion G1 of the groove G may be formed much higher.

Next, a top surface of the second conductive film 66 formed between the pair of the first conductive film patterns 56 is planarized through an etchback process. Since the top of the second conductive film 66 approximately has a morphology as shown in a dotted line of FIG. 5a through the etchback process, the groove G formed between the first conductive film patterns 56 is removed, or the depth of the groove G is minimized.

Next, a photoresist pattern 68 is formed on the top of the second conductive film 66 as shown in FIG. 5b. The photoresist pattern 68 approximately has an opening defining an active region of the substrate between the first conductive films 56. If the second conductive film 66 is etched using the photoresist pattern 68 as an etching mask, a pair of split gates each having the first conductive film pattern 56 and a second conductive film pattern 66a are formed as shown in FIG. 5c.

Figure 1:
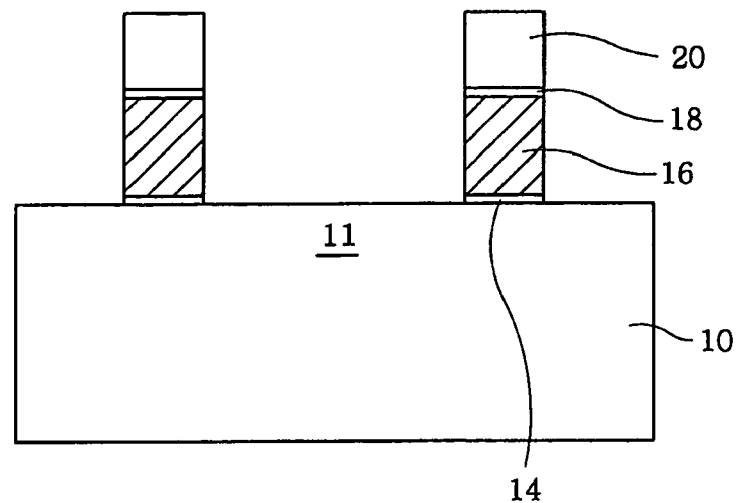
FIGS. 1 to 3 are views illustrating a method of manufacturing a conventional split gate type non-volatile memory device.
Figure 2:
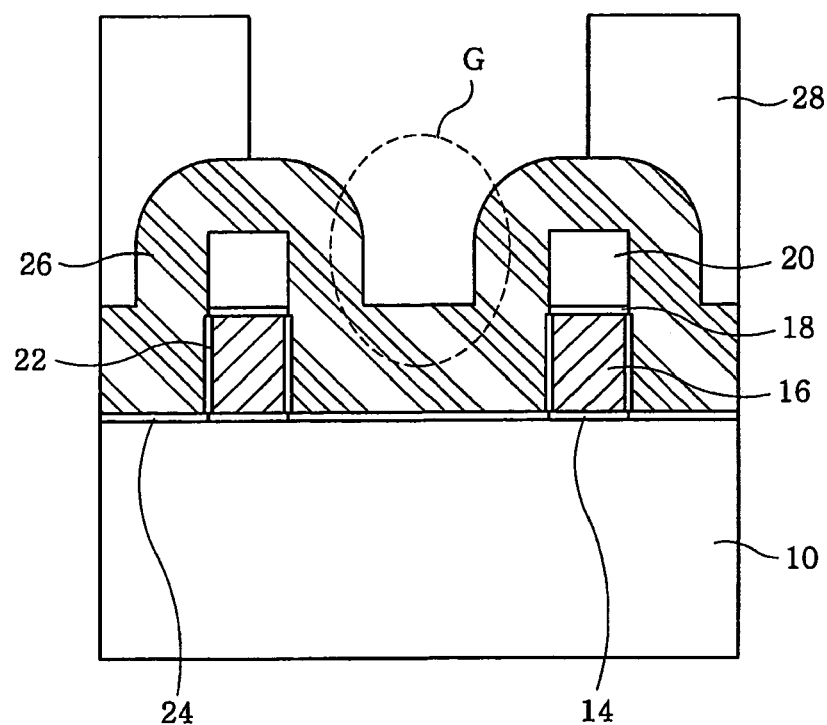
Figure 3:
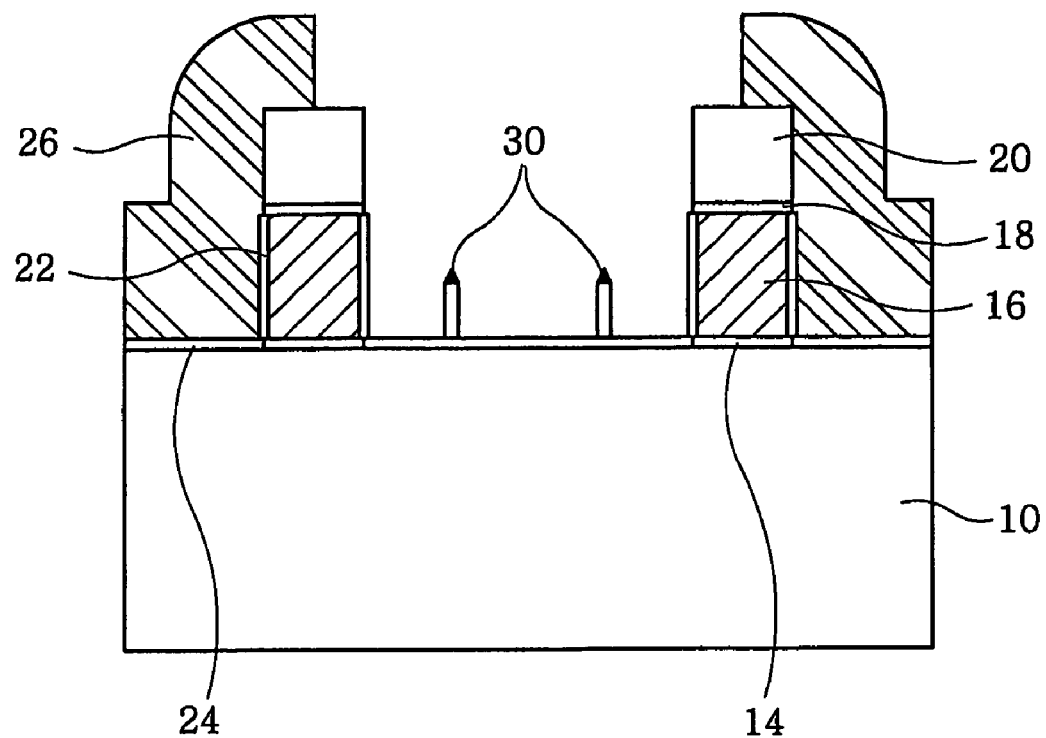

In the conventional method, since the second conductive film 26 is deposited along the sidewalls of the first conductive film patterns 16 as shown in FIG. 2, the groove G is formed therebetween, and a residual product such as a polymer produced during an anisotropic etching process is attached on the sidewall of the groove G. Accordingly, the produced residual products are resided on the active region 11 after the second conductive film 26 has been completely etched so that they remain as conductive stringers serving as a cause of an obstacle in forming a silicide or contact in a subsequent process.

Figure 4A:
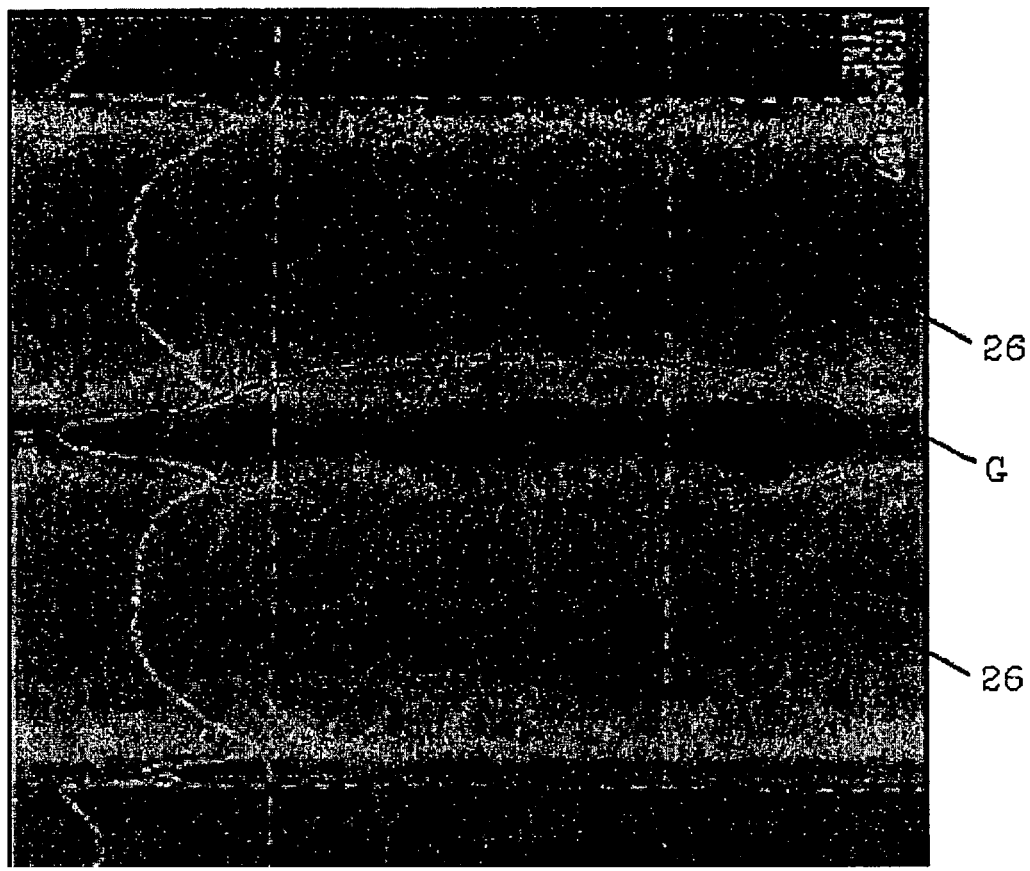
Figure 4B:
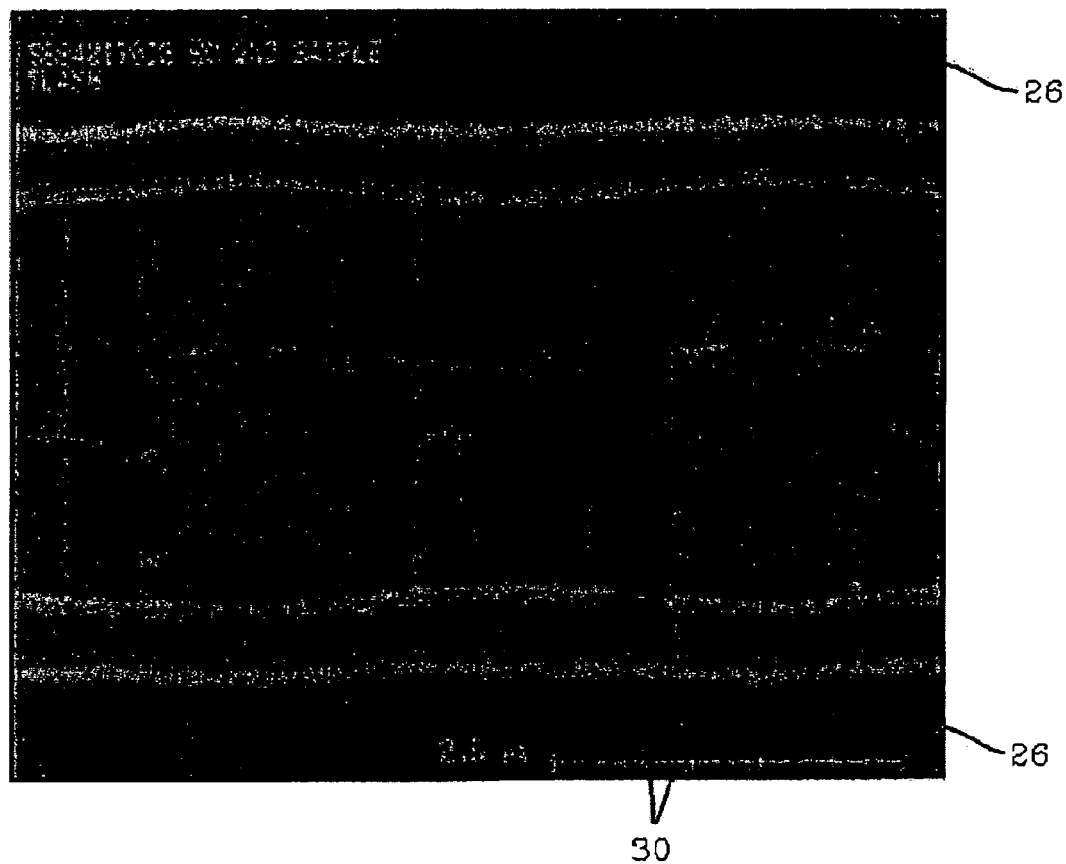
Figure 4C:
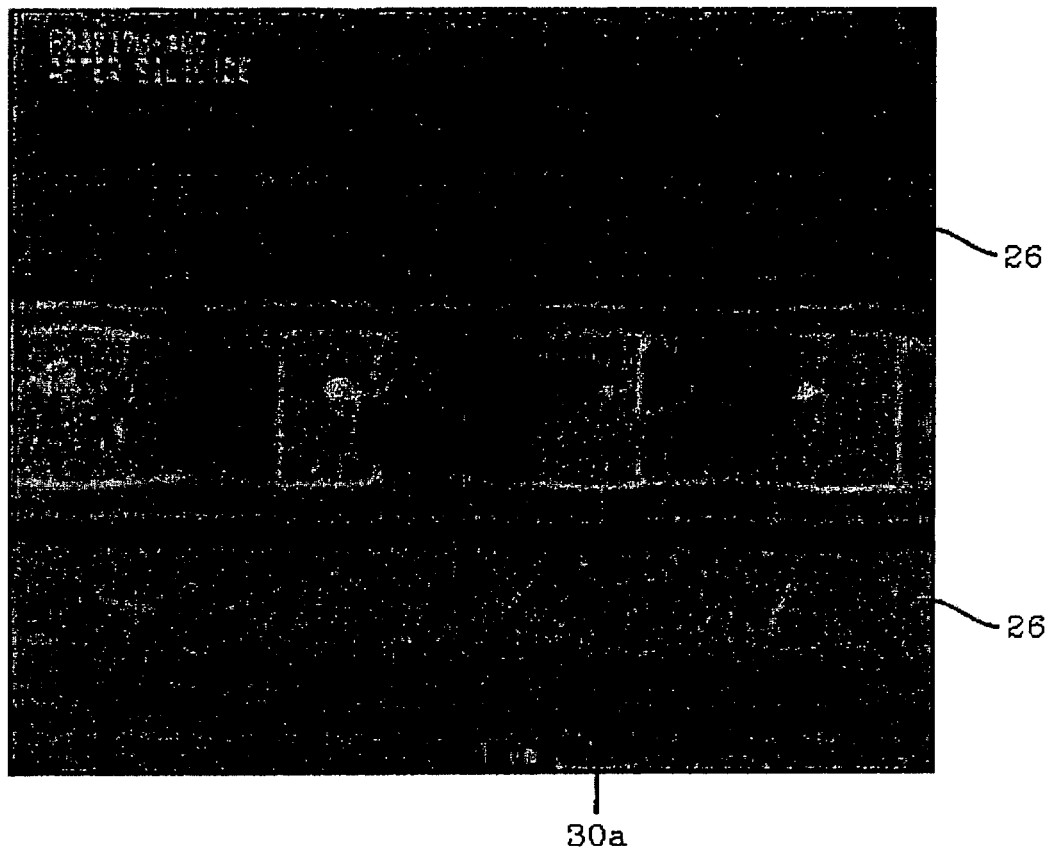

However, according to embodiments of the present invention, since the groove G of the second conductive film 66 formed between the first conductive film patterns 56 can be removed through the etchback process of the second conductive film 66, a polymer and the like do not remain in the active region even after the second conductive film 66 has been etched. Thus, stringers 30 do not produced as shown in FIG. 4b.

According to embodiments of the present invention, conductive stringers can be prevented from being resided in an active region due to a groove between split gates. As a result, there can be prevented the increase of resistance due to the conductive stringers and the production of particles in a subsequent process. Since, in order to remove the stringers, it is unnecessary to lower the height of a first conductive film or to increase time for overetching, a reliable device can be provided.

While the invention has been shown and described with respect to various embodiments, it will be understood by those skilled in the art that various changes and modifications may be made without departing from the spirit and scope of the invention as defined in the following claims.

What is claimed is:

1. A method of manufacturing a split gate type non-volatile memory device, comprising the steps of:
    defining an active region on a semiconductor substrate;
    forming a pair of first conductive film patterns, each having an electric charge storage layer interposed between the substrate and the first conductive film pattern, on the active region;
    forming a second conductive film on top of the first conductive film patterns and the active region outside the first conductive film patterns;
    etchbacking the entire surface of the second conductive film to planarize a top of the second conductive film formed between the first conductive film patterns;
    forming a photoresist pattern, with an opening corresponding to the active region between the first conductive film patterns, on the second conductive film; and
    forming a pair of split gates each having one of the first conductive film patterns and a second conductive film pattern formed by patterning the second conductive film using the photoresist pattern as an etching mask.

2. The method of claim 1, wherein the step of forming the first conductive film patterns comprises the steps of:
    forming the electric charge storage layer and a first conductive film on the active region of the substrate; and
    sequentially patterning the first conductive film and the electric charge storage layer and to form the first conductive film patterns facing each other.

3. The method of claim 2, further comprising the step of forming a capping insulation film on the first conductive film, wherein the sequentially patterning step sequentially patterning and the electric charge storage layer and the capping insulation film, the first conductive film.

4. The method of claim 1, further comprising the steps of:
    forming sidewall insulation film on each sidewall of the first conductive film patterns before the step of forming the second conductive film; and
    forming a gate insulation film on the active region at both sides of the first conductive film patterns.

5. The method of claim 1, wherein the second conductive film is formed with a groove between the first conductive film patterns and the deepest portion of the groove is still higher than a top of each of the first conductive film patterns.

6. The method of claim 5, wherein the step of etchbacking the second conductive film is performed until the groove is completely removed.

7. The method of claim 5, wherein the step of etch-backing the second conductive film is performed until the groove is substantially removed.

8. The method of claim 3, wherein the second conductive film is formed with a groove between the first conductive film patterns, and the deepest portion of the groove is still higher than a top of the capping insulation film on each of the first conductive film patterns.

9. The method of claim 8, wherein the step of etch-backing the second conductive film is performed until the groove is completely removed.

10. The method of claim 8, wherein the step of etch-backing the second conductive film is performed until the groove is substantially removed.

11. A method of manufacturing a split gate type non-volatile memory device, comprising the steps of defining an active region on a semiconductor substrate;
    forming a pair of first conductive film patterns facing each other on the active region;
    forming a second conductive film on top of, at least, the first conductive film patterns, wherein the second conductive film is formed with a groove between the first conductive film patterns, and wherein the deepest portion of the groove is still higher than a top of each of the first conductive film patterns;
    planarizing a top surface of said second conductive film to minimize a depth of said groove; and
    patterning the second conductive film to form on each of the first conductive film patterns a second conductive film pattern, thereby obtaining a pair of split gates.

12. The method of claim 11, further comprising the step of forming a capping insulation film on each of the first conductive film patterns prior to the step of forming the second conductive film;
    wherein the second conductive film is formed on top of the capping insulation film with the groove located between the first conductive film patterns, and wherein the deepest portion of the groove is still higher than a top of the capping insulation film on each of the first conductive film patterns.

* * * * *